United States Patent
Grebs et al.

(10) Patent No.: US 6,818,947 B2
(45) Date of Patent: Nov. 16, 2004

(54) BURIED GATE-FIELD TERMINATION STRUCTURE

(75) Inventors: Thomas E. Grebs, Mountaintop, PA (US); Christopher B. Kocon, Plains, PA (US); Rodney S. Ridley, Sr., Mountaintop, PA (US); Gary M. Dolny, Mountaintop, PA (US); Nathan Lawrence Kraft, Wilkes-Barre, PA (US); Louise E. Skurkey, Conyngham, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/247,464

(22) Filed: Sep. 19, 2002

(65) Prior Publication Data

US 2004/0056302 A1 Mar. 25, 2004

(51) Int. Cl.⁷ ............................................... H01L 29/76
(52) U.S. Cl. ........................ 257/330; 257/329; 257/331; 257/332; 438/259; 438/270; 438/271; 438/589
(58) Field of Search ................................... 257/302–339

(56) References Cited

U.S. PATENT DOCUMENTS

| | | |
|---|---|---|
| 4,876,579 A | 10/1989 | Davis et al. |
| 5,233,215 A | 8/1993 | Baliga |
| 5,578,851 A | 11/1996 | Hshieh et al. |
| 5,605,852 A | 2/1997 | Bencuya |
| 5,639,676 A | 6/1997 | Hshieh et al. |
| 6,110,763 A | 8/2000 | Temple |
| 6,188,105 B1 | 2/2001 | Kocon et al. |
| 6,362,026 B2 | 3/2002 | Zeng et al. |

OTHER PUBLICATIONS

B. Jayant Baliga, Power Semiconductor Devices, Chapter 3: Breakdown Voltage; Section 3.6, Edge Terminations, pp. 81–112, PWS Publishing Company, Boston, MA, Copyright 1996.

*Primary Examiner*—Fetsum Abraham
(74) *Attorney, Agent, or Firm*—Laurence S. Roach, Esq.; Law Office of Thomas R. FitzGerald

(57) ABSTRACT

In a power semiconductor device 10, a continuous trench has an outer circumferential portion 58 that includes a field plate and inner portions 28 that carry include one or more gate runners 34 to that the gate runners and the field plate are integral with each other. The trench structure 58, 28 is simpler to form and takes up less surface space that the separate structures of the prior art. The trench is lined with an insulator and further filled with conductive polysilicon and a top insulator.

10 Claims, 5 Drawing Sheets

BURIED GATE-FIELD TERMINATION STRUCTURE

FIELD OF THE INVENTION

This invention relates to semiconductor devices and, more particularly, to semiconductor power devices and methods for fabricating such devices.

BACKGROUND OF THE INVENTION

There continues to be a growing demand for power switching devices, i.e., transistor devices capable of carrying large currents at high voltages. Such devices include bipolar and field effect devices including, for example, the Insulated Gate Bipolar transistor (IGBT) and the Metal Oxide Semiconductor Field Effect Transistor (MOSFET). Desirable characteristics of such devices include low on-resistance, fast switching speeds and low current draw during switching operations. That is, it is desirable to switch from an "off" state to an "on" state by applying a bias voltage to the gate electrode while experiencing only a small amount of current flow based on minimal capacitance inherent to the gate structure.

Notwithstanding significant advances in power device technologies, there remains a need to provide still higher-performing and more cost-efficient devices. For example, it is desirable to further increase current density relative to the total die area of a device. One of the limiting factors to higher current ratings is the breakdown voltage, particularly in the edge termination region. That is, because semiconductor junctions are not infinitely parallel, but include curvature, numerous techniques are employed to avoid otherwise high concentrations of electric field lines. Absent inclusion of so-called edge-termination designs, e.g., field rings, channel stop implants and field plates, to overcome degradation in the breakdown voltages, it would not be possible to approach the theoretical breakdown voltage of a semi-infinite junction. However, it is undesirable that, conventionally, a significant portion of the device die area must be devoted to edge termination designs in order to address this problem.

Breakdown voltage phenomena are well understood and the literature is replete with examples of edge termination designs. See, for example, see Ghandhi, *Semiconductor Power Devices*, John Wiley & Sons, Inc., 1977 (ISBN 0-471-029998), incorporated herein by reference, which discusses this subject at chapter two. See, also, Baliga, *Modern Power Devices*, Krieger Publishing Company, Malabar, Fla., 19920 (ISBN0894647997), also incorporated herein by reference, which provides relevant discussion at chapter three. In addition to conventional field rings and field plates, trenched field plates have been considered for edge termination applications. U.S. Pat. No. 5,233,215 discloses use of one or more trenched, floating field plates in combination with field rings in order to terminate a silicon carbide MOSFET. U.S. Pat. No. 5,578,851 discloses field rings separated by trenches, allowing the field rings to be closely spaced in order to conserve area. The trenches may be filled with polysilicon electrically connected to the MOSFET gate electrode. Nonetheless trench termination structures continue to occupy significant portions of the device die area and there is a need to provide termination techniques which are more area efficient. It is also desirable to reduce the manufacturing costs associate with high voltage performance. These and other benefits will be apparent from the invention that is now described.

SUMMARY OF THE INVENTION

An improved semiconductor power device is now provided. In one embodiment of the invention the device includes a semiconductor layer having a transistor region including a source/drain formation and a termination region surrounding the transistor region. The termination region includes an outer periphery corresponding to an edge of the device. A conductor, configured for connection to a voltage supply, includes first and second conductor portions. The first conductor portion is positioned in the transistor region to control current flow through the source/drain formation and the second conductor portion is positioned in the termination region. The second conductor portion includes a contact for connection to the voltage supply and a feed comprising conductive material formed in a trench extending along the outer periphery and around the transistor region. The feed portion electrically connects the contact portion with the first conductor portion.

An exemplary device according to the invention includes a layer of semiconductor material having an active device region and a peripheral region surrounding the active region. A transistor device formed in the active region has a gate region including a gate conductor formed in a trench. The gate conductor is electrically isolated from the semiconductor layer by a relatively thin insulator. A second trench is formed along the peripheral region and includes a second conductor formed therein with a relatively thick insulator positioned to electrically isolate the second trench conductor from the semiconductor layer.

An associated method for manufacturing a semiconductor device includes providing on a layer of semiconductor material an active region and a termination periphery region surrounding the active region with a trenched transistor formation in the active region. A trenched gate runner is formed in the termination region along the active region.

A method for operating a semiconductor device includes providing a semiconductor layer with an active transistor region and a trenched field plate positioned about the transistor region for increasing breakdown voltage. The field plate operates as a conductive feed to control switching of transistors in the active region. As such, the invention reduces the number of elements needed to make a power transistor by combining the gate runners and the field plate into one structure. The invention thus reduces the number of steps needed to make a device. Likewise, it increases the effective useable area of substrate so that substrates made with the invention can handle larger currents.

BRIEF DESCRIPTION OF THE DRAWINGS

The invention will be more fully understood when the following detailed description is read in conjunction with the drawings wherein.

Figure 1:
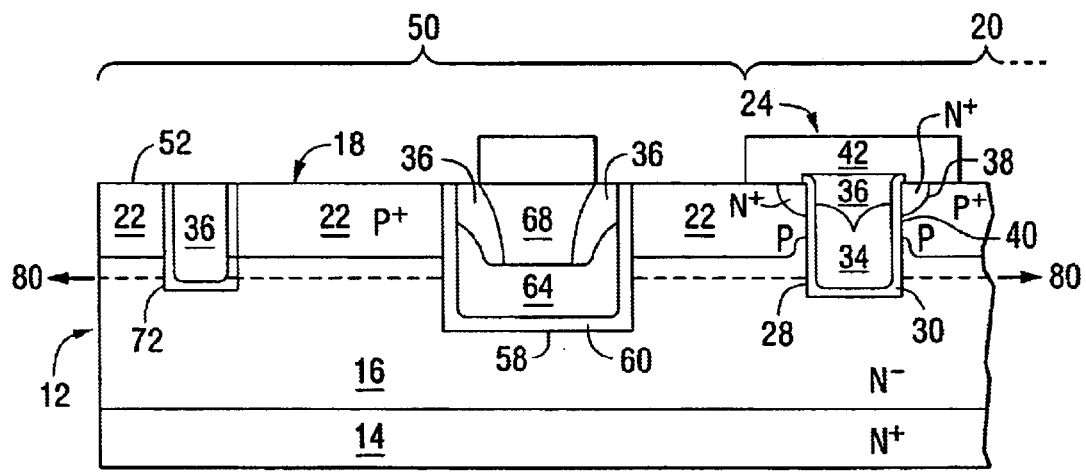
FIG. 1 is a partial view in cross section of a semiconductor device incorporating the invention.

In accord with common practice the various illustrated features in the drawings are not to scale, but are drawn to emphasize specific features relevant to the invention. Moreover, the sizes of features and the thicknesses of layers may depart substantially from the scale with which these are shown. Reference characters denote like elements throughout the figures and the text.

DETAILED DESCRIPTION OF THE INVENTION

The partial cross sectional view of FIG. 1 illustrates a P-channel MOSFET device 10 formed in a semiconductor layer 12, including N+ lower layer 14 and N− upper layer 16 which may, for example, be epitaxially grown. The layer 16 has an upper surface 18. A P+ diffusion region 22 extends from the surface 18 into the upper layer 16. An active transistor region 20 of the device 10 (right side of drawing) includes a repetitive pattern of MOS cell structures each having a vertical source/drain formation. For simplicity of illustration only one exemplary MOSFET cell 24 is shown extending through a body region portion of the diffusion region 22. The device 10 will include many MOSFET cells, although the specific design of the cell 24 is exemplary the invention is not at all limited to any particular type of cell design nor limited solely to MOSFET devices.

The cell 24 comprises a trench 28, conventionally lined with a thermally grown gate oxide layer 30 having thickness in the range of 800 to 1200 Angstroms (80 to 120 nm). The trench may have a depth on the order of 1.5 to 3 microns with a width of one to two microns and is substantially filled with conductive material, e.g., doped polysilicon, to form a conductive gate electrode 34. The balance of the trench opening is conventionally filled with deposited insulator 36 which may, for example, be borophosphorosilicate glass (BPSG). N+ source region 38 is formed along the surface 18 in an upper portion of the layer 16 surrounding the trench 28. Lightly P-doped channel region 40 is formed in the otherwise more heavily doped diffusion region 22, between the source region 38 and that portion of the N− layer 16 along the trench 28 which forms the drift region of the cell 24. The oxide layer 30 provides electrical isolation between the gate electrode 34 and each of the source region 38, channel region 40 and N− layer 16 (drain), allowing a conductive inversion layer to form in the channel region 40 when a voltage is applied to the gate electrode 34 relative to the source region 38. A source contact 42, e.g., Al, is provided for connection to the P+ region 22 as well as the source region 38 in order to suppress parasitic NPN bipolar effects which could occur under forward bias conditions, i.e., with the combination of the N+ region 38, the P+ region 22 and the N-type layers 14 and 16.

Still referring to FIG. 1, a termination region 50 (left side of drawing) extends from the active region 20 to the outer periphery 52, i.e., the die edge, of the device 10. A gate runner trench 58 having depth and width substantially larger than that of the trench 28 is formed through the P+ region 22 in the termination region 50. It may, for example, be 3 to 6 microns deep and 3 to 5 microns wide, but the trench 58 could be made substantially larger based on the desired device characteristics. The trench 58 is lined with a relatively thick insulative layer 60, e.g., 1.5 or more times the thickness of the gate oxide layer 30 and, preferably, at least 300 to 500 nm.

Preferably, initial portions of the insulative layer 60 are formed before the gate oxide layer 30 is formed, but the layer 60 may include the thermally grown layer 30 as a component thereof. Preferably the insulative layer 60 predominantly comprises thermally grown or deposited silicon oxide, but may be formed with other dielectric materials. The trench 58 is substantially filled with conductive material 64, and if this is the same deposit of doped polysilicon which forms the conductive gate electrode 34, then the gate electrode 34 and the conductive material 64 will be integrally formed and a continuous layer, although they each may retain different functionalities. The remaining upper portion of the trench 58 is lined with the deposited insulator 36, e.g., BPSG and a metal contact 68, preferably Al, is formed thereover.

The diffusion region 22 extends from the active region 20, through the termination region to the die edge. An isolation trench 72, which may be formed at the same time as the trench 28, includes the thermally grown oxide layer 30 and the deposited insulator 36, preferably BPSG.

Figure 2:
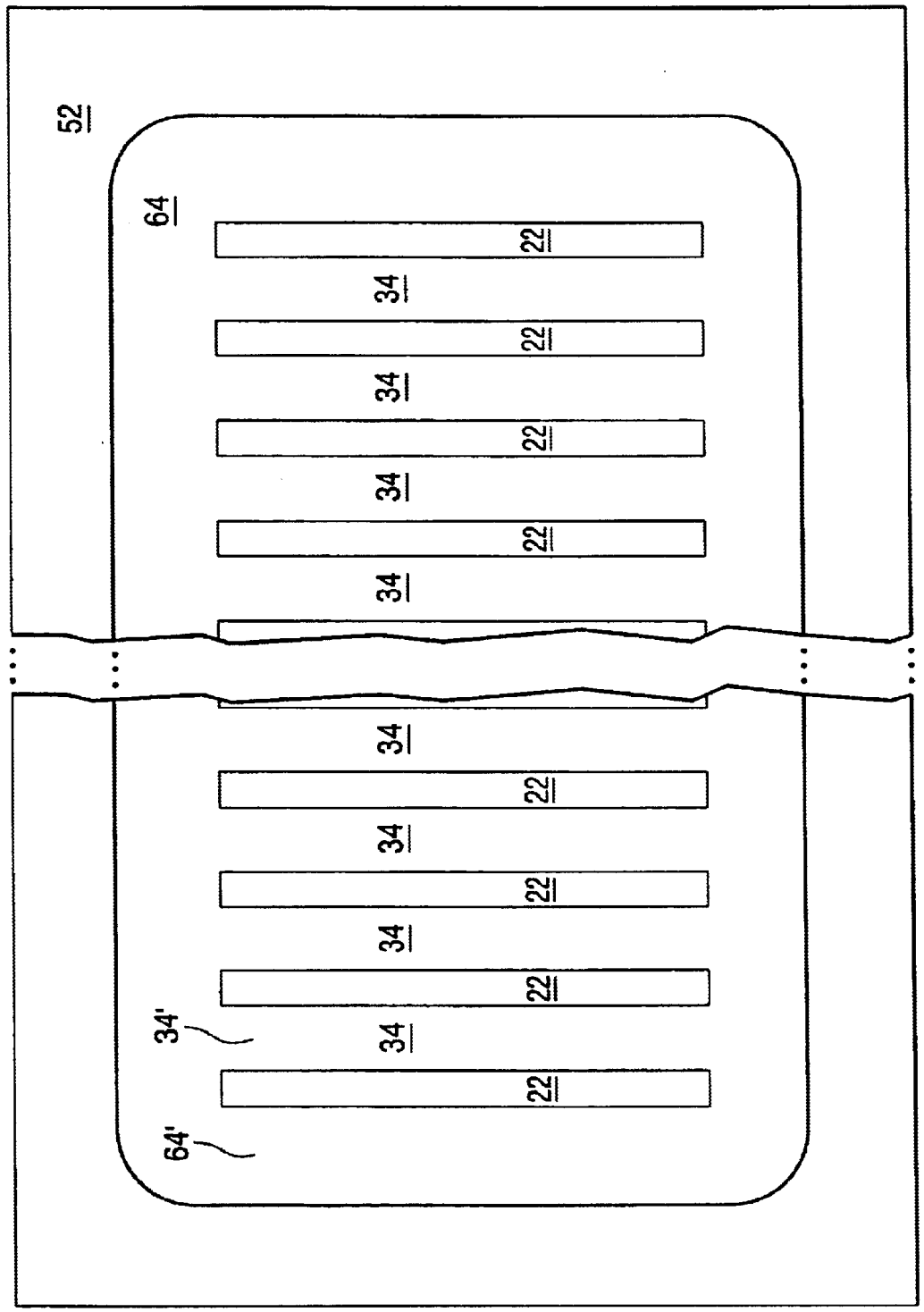
FIG. 2 is a plan view taken of the FIG. 1 device.

FIG. 2 is a simplified plan view of the device 10 taken along the cut-line 80 of FIG. 1, illustrating a combination of an exemplary pattern of the trenched conductive material 64 and an exemplary pattern the trenched gate electrode 34. For the FIG. 2 embodiment the partial view of FIG. 1 corresponds to a cross section taken through an end-most trenched gate electrode 34, referenced in the drawing as 34' and through the adjacent portion of the conductive material 64, referenced in the drawing as 64'. It should be recognized that, for each illustrated gate electrode 34 in FIG. 2, there is a corresponding MOS cell structure (not illustrated in FIG. 2) such as a MOSFET cell 24. For purposes of illustration the gate electrodes 34 of only a few trenches 28 of the device 10 are shown, and neither the outline of the trenches 28 nor the gate oxide layers 30 are shown in FIG. 2. A typical power device may include many more trenched gate electrodes than illustrated in the figures.

In the FIG. 2 embodiment the trenched conductive material 64 extends along the die edge 52 to provide a field plate termination. The isolation trench 72 (not shown in FIG. 2) may also extend along the die edge 52. With a metal contact (such as the contact 68 of FIG. 1) connecting a gate voltage supply with the conductive material 64, the conductive material 64 may be integrally formed in connection with the gate electrodes 34 to feed the gate signal to each MOSFET cell 24. Thus the trench 58 with conductive material 64 also serves as the gate runner, in order to feed the external gate supply to each of multiple electrodes 34. A feature of the invention is provision of one trenched conductor to serve as both a field plate and a gate runner to the several MOS cells in a device structure.

An exemplary method of making the device 10 is illustrated in FIGS. 3A–3D, showing primarily those steps relevant to formation of the trenches 28 and 58. Other conventional steps and process details for formation of power switching devices are not described as these will be readily apparent to those skilled in the art.

Figure 3A:
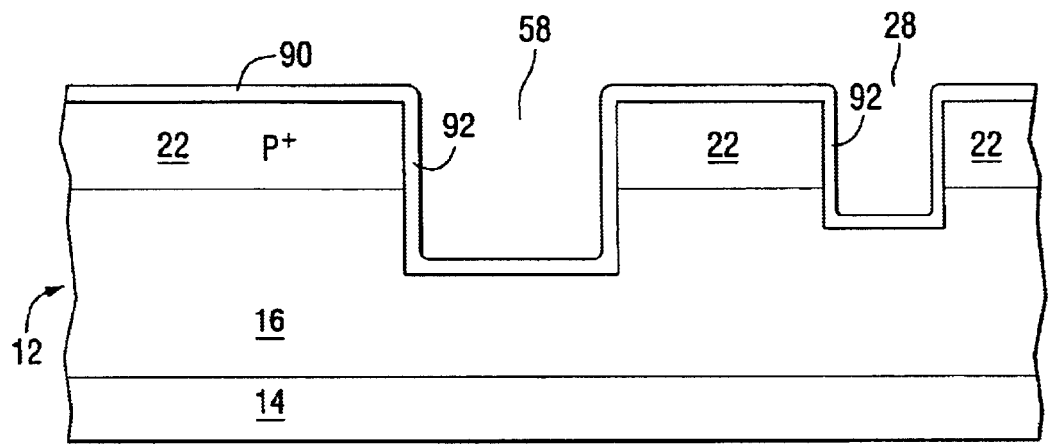
FIGS. 3A–3C illustrate a sequence of fabrication steps according to the invention.

With reference to FIG. 3A, the method for fabricating the device 10 is illustrated beginning with the semiconductor layer 12 shown to have the N+ lower layer 14 and N− upper layer 16 formed therein. A conventional P+ implant has been made through the surface 18, and is shown after diffusion to create the P+ region 22. A low-temperature silicon oxide 90 is formed over the eventual surface 18 followed by a conventional pattern and etch to form the trenches 28 and 58. If it is desired to have the trenches 58 extend deeper into the layer 12, e.g., substantially further into the N− upper layer 16 than the trenches 28, then separate pattern and etch steps are had to create this feature. The trenches are shown lined with a sacrificial thermal oxide layer 92.

Figure 3B:
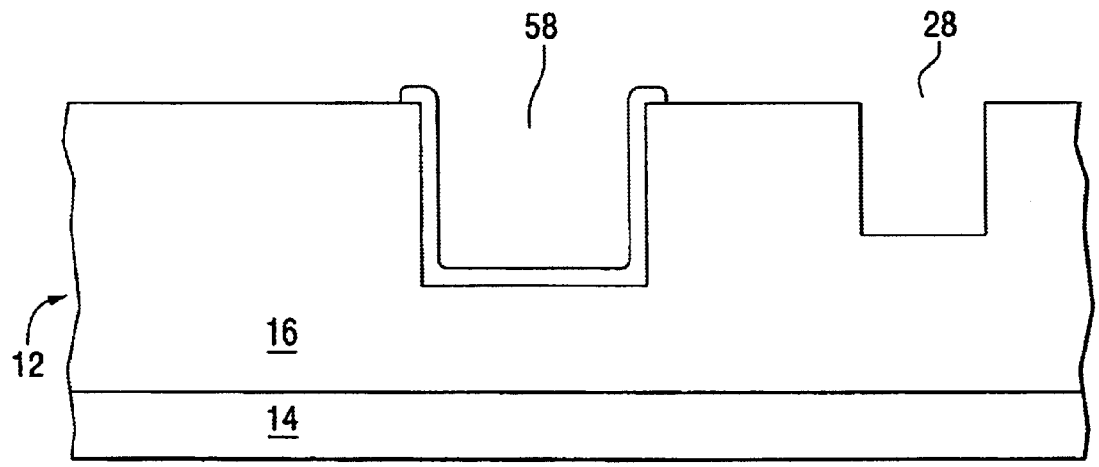

Referring next to FIG. 3B, once the trenches are defined, it is preferable to simultaneously remove both the low-temperature oxide layer 90 and the sacrificial thermal oxide layer 92, e.g., by a wet etch. Next, the trenches 28 are masked so that the thick layer 60 of silicon oxide, e.g., deposited by chemical vapor deposition (CVD), is selectively formed in the trenches 58 without formation of the same oxide in the trenches 28. Alternately, the thick oxide layer 60 may be formed overall and selectively removed from the trenches 28 by a pattern and etch process.

Figure 3C:
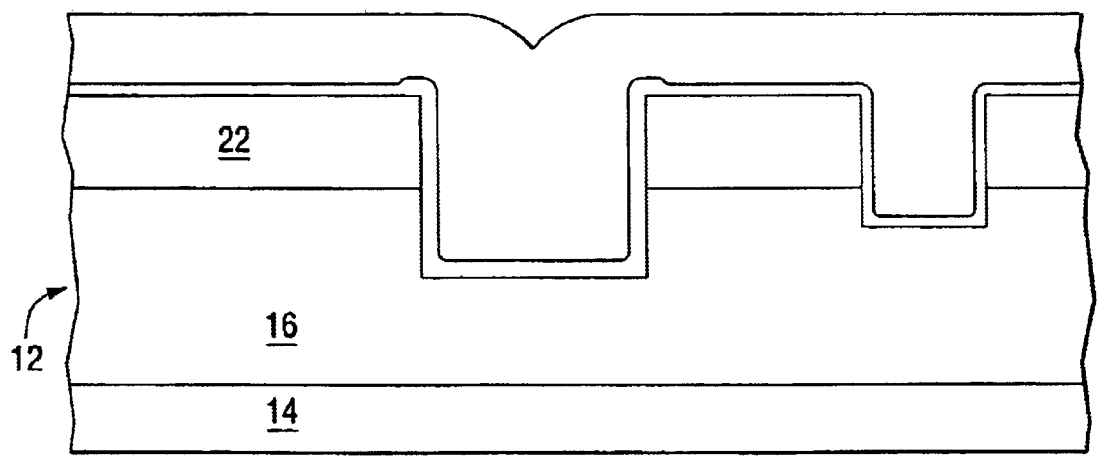

After the thick oxide layer 60 is defined in the trench 58 (and subsequent to removal of any masking from over the trenches 28 or 58, the high quality thermal gate oxide layer 30 is grown to a thickness on the order of 100 nm. Although the gate oxide layer 30 is intended primarily for formation in the trenches 28, it may also be formed in the trenches 58 to add to the thickness of the layer 60. The interim structure is shown in FIG. 3C with a polysilicon layer 96 deposited by CVD, which is subsequently patterned to form the gate electrode 34 and conductive material 64 of trench 58 as shown in FIG. 1. Subsequent process steps are conventional and need not be separately illustrated to describe the formation of other features shown in FIG. 1. After formation of the contacts 42 and 68 as shown for the structure of FIG. 1 conventional insulator is applied over the exposed surface.

An advantage of the invention is that the edge termination feature, e.g., the trench 58, need not be separately formed. Rather, definition of a termination trench with the same lithography steps as the trench 28 avoids raised topology effects which can otherwise obscure smaller feature definition. With the invention it is now possible to reduce the spacing between the active trenches 28 and the termination region 50 without experiencing adverse lithographic effects such as a reduction in the width of a trench 28 formed immediately next to a trench 58.

Figure 4A:
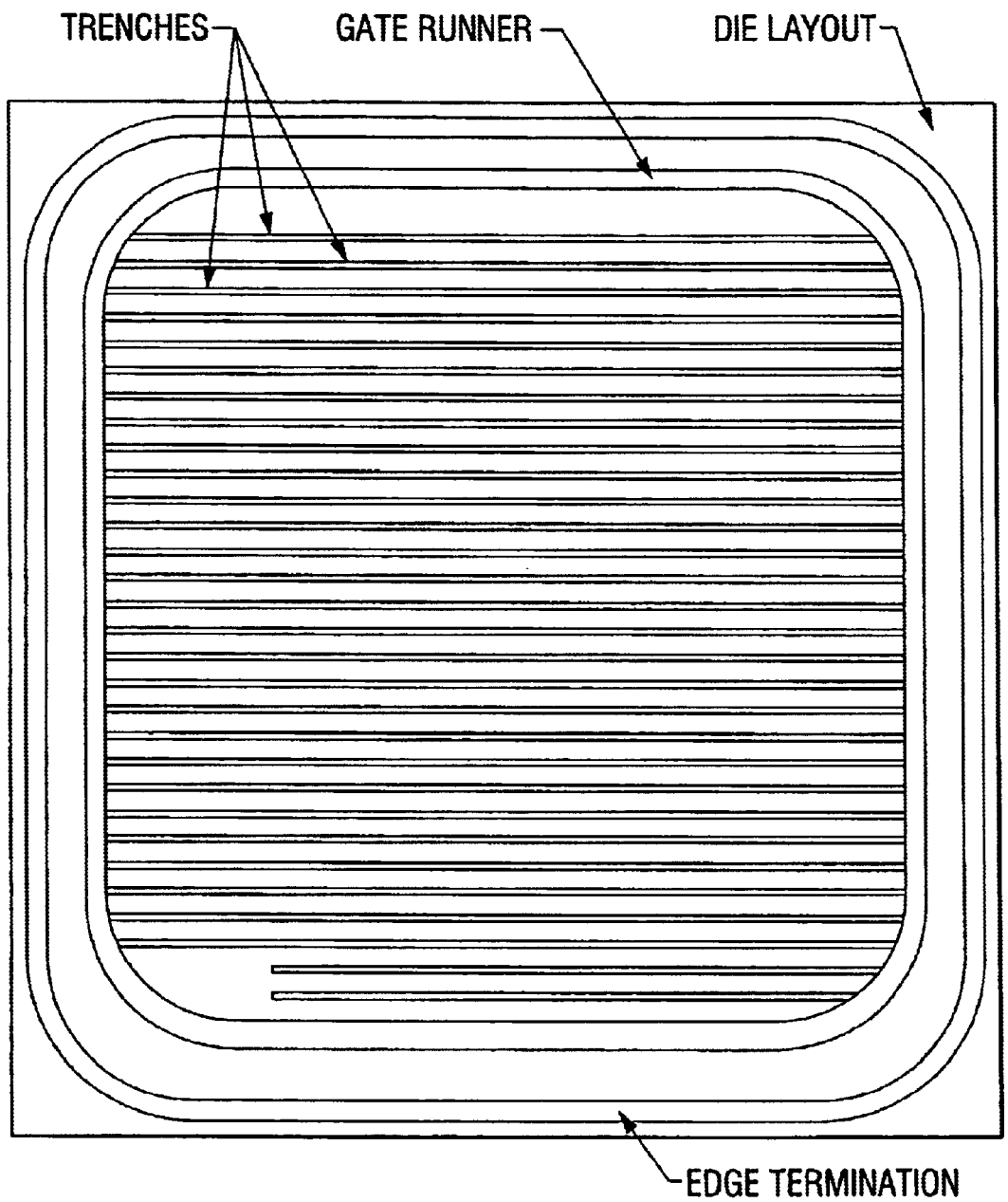
FIG. 4A is a to view of prior art using planar edge termination and gate runner structures.
Figure 4B:
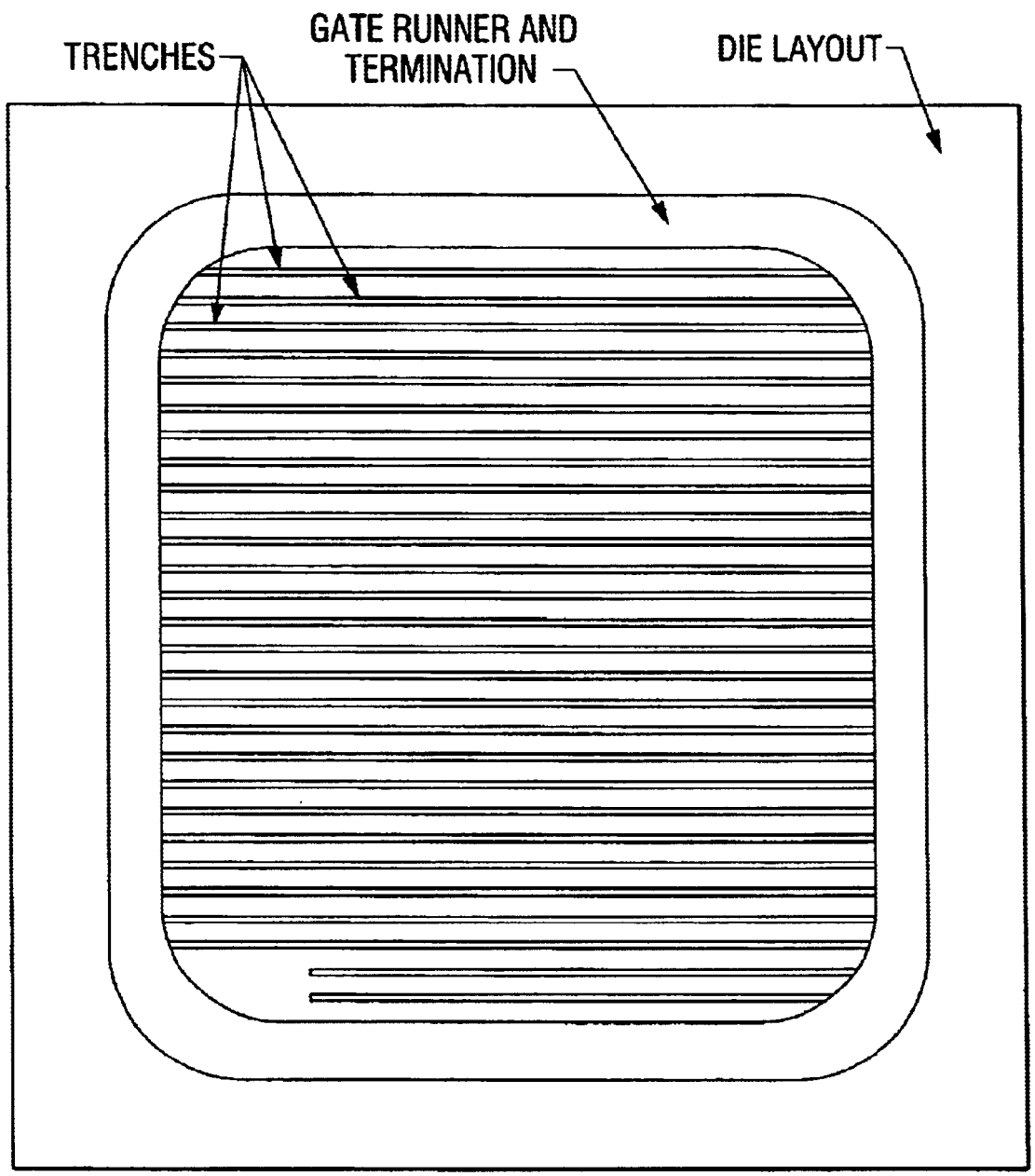
FIG. 4B is a to view of the invention using buried termination and gate runner structures.

FIG. 4A shows a top view of the prior art using planar edge termination and gate runner structures. FIG. 4B shows the ton view of the invention using buried termination and gate runner structures. By integrating the termination structure with the gate runner structure there is a reduction in the total die area required to effect both of these functions. For example, the distance from the die edge periphery 52 to the first active trench 28 may be about 20 microns, while for a device of similar rating but with a conventional edge termination structure, the distance from the edge of the die to the first active trench will be on the order of 120 microns. Also, having the termination region 50 include a portion of region 22 there is no need for a separate implant step, this resulting in a reduction in the number of processing steps required for manufacture of the device. With the termination structure formed in a trench that is simultaneously formed with the gate oxide trench, the overlying surface topography is planar, i.e., not characterized by steps due to oxide formation, and this avoids puddling of photoresist which is known to compromise lithographic image integrity.

Generally, the invention enables a higher breakdown voltage at the die edge with a reduced number of process steps. Although the invention has been described for a particular device type, the concepts apply to edge termination design for a wide variety of devices types and there is no limit on the voltage range of devices with which the invention may be practiced. The design principles may be readily applied to prevent breakdown voltages well in excess of 200 volts.

An architecture and process have been described for an improved semiconductor device. Exemplary embodiments have been disclosed while other embodiments of the invention, including structures composed of compound semiconductor materials, will be apparent. It is also to be understood that when a layer has been described or illustrated as positioned on or over another layer, there may be another intervening layer (not illustrated) associated with the same or an alternate embodiment of the invention. Moreover, although the invention has been illustrated for one set of conductivity types, e.g., N channel devices, application of the invention is contemplated for opposite conductivity-type devices as well. Because the invention may be practiced in a variety of ways, the scope of the invention is only limited by the claims which now follow.

We claim:

1. A switchable semiconductor power device of the type which controls current conduction based on field effect principles, comprising:
    a semiconductor layer having a transistor region including a source/drain formation and a termination region surrounding the transistor region, said termination region including an outer periphery corresponding to an edge of the device; and
    a single conductor, configured for connection to a gate voltage supply, including first and second conductor portions with the first conductor portion formed in a trench and being positioned in the transistor region to control current flow through the source/drain formation and the second conductor portion positioned in the termination region, the second conductor portion:
        including a contact for connection to the gate voltage supply; and
        including a feed comprising conductive material formed in a trench extending along the outer periphery and around the transistor region, said feed electrically connecting the contact with the first conductor portion; and acting as a field plate to extend the device breakdown voltage in the termination region; and
    an isolation trench extending into the semiconductor layer and positioned between the edge of the device and the second conductor portion.

2. The device of claim 1 further comprising a plurality of additional source/drain formations each configured with the first conductor portion in and about a trench region to provide a voltage-switchable conduction channel for controlling current flow through the semiconductor layer.

3. The device of claim 1 wherein the transistor region comprises a vertical MOSFET device.

4. A method for manufacturing a semiconductor device, comprising:
    providing on a layer of semiconductor material an active region and a termination periphery region surrounding the active region with a trenched transistor formation in the active region;
    forming a trenched gate runner in the termination region along the active region; and
    forming first and second conductor regions such that said first and second conductor regions are electrically connected to form a continuous conductor with multiple regions and said first conductor region is in said trenched transistor formation and said second conductor region is said trenched gate runner such that said second conductor also acts as a field plate termination; wherein
    the trenched gate runner extends further into the layer of semiconductor material than the trenched transistor formation.

5. A method for manufacturing a semiconductor device, comprising:

providing on a layer of semiconductor material an active region and a termination periphery region surrounding the active region with a trenched transistor formation in the active region;

forming a trenched gate runner in the termination region along the active region, the trenched transistor formation including a gate conductor formed simultaneously with the gate runner by deposition of polysilicon; and forming first and second conductor regions such that said first and second conductor regions are electrically connected to form a continuous conductor with multiple regions and said first conductor region is in said trenched transistor formation and said second conductor region is said trenched gate runner such that said second conductor also acts as a field plate termination the trenched transistor formation including a gate conductor formed simultaneously with the gate runner by deposition of polysilicon 6. A semiconductor structure comprising:

a layer of semiconductor material having an active device region and a peripheral region surrounding the active region;

a transistor device formed in the active region including a plurality of source regions on one surface and drain region on the opposite surface;

a trench having an outer annular portion disposed in the peripheral region and enclosing the transistor device, the walls and the floor of the outer annular portion lined with an insulator and the outer annular portion filled with conductive material for forming a field plate around the transistor regions; and a plurality of elongated inner runners extending in the same direction across the one surface with the source regions and intersecting the outer annular portion at opposite ends of the runners, the runners having their floors and their walls lined with a gate insulating material and the runners filled with a conductor to form a gate structure in the transistor region to control current between the source regions and the drain.

7. The semiconductor of claim 6, wherein the conductor material comprises conductive polysilicon.

8. The semiconductor of claim 7, further comprising a layer of metal on the conductive polysilicon.

9. The semiconductor of claim 7 wherein the insulator in the outer annular portion is thicker than the gate insulator in the runners.

10. The semiconductor of claim 7 wherein a common layer of conductive polysilicon fills the trench.

* * * * *

UNITED STATES PATENT AND TRADEMARK OFFICE
CERTIFICATE OF CORRECTION

PATENT NO. : 6,818,947 B2
DATED : November 16, 2004
INVENTOR(S) : Thomas E. Grebs et al.

It is certified that error appears in the above-identified patent and that said Letters Patent is hereby corrected as shown below:

Column 1,
Line 55, replace "trenched" with -- trenches --

Column 2,
Lines 62 and 64, replace "to" with -- top --

Column 4,
Line 64, replace "are had" with -- can be used --

Column 5,
Line 36, replace "ton" with -- top --

Signed and Sealed this

Twenty-ninth Day of March, 2005

JON W. DUDAS
*Director of the United States Patent and Trademark Office*